United States Patent
Gupta et al.

(10) Patent No.: US 10,234,492 B2
(45) Date of Patent: Mar. 19, 2019

(54) DATA CENTER MONITORING BASED ON ELECTROMAGNETIC WAVE DETECTION

(71) Applicant: CA, Inc., New York, NY (US)

(72) Inventors: Smrati Gupta, Barcelona (ES); Thomas Howard Ferrin, Fort Collins, CO (US); Victor Muntés-Mulero, Barcelona (ES)

(73) Assignee: CA, Inc., New York, NY (US)

( * ) Notice: Subject to any disclaimer, the term of this patent is extended or adjusted under 35 U.S.C. 154(b) by 184 days.

(21) Appl. No.: 15/252,985

(22) Filed: Aug. 31, 2016

(65) Prior Publication Data
US 2018/0060203 A1    Mar. 1, 2018

(51) Int. Cl.
G06F 11/30    (2006.01)
G01R 29/08    (2006.01)
G06F 11/34    (2006.01)

(52) U.S. Cl.
CPC ..... *G01R 29/0892* (2013.01); *G01R 29/0878* (2013.01); *G06F 11/3058* (2013.01); *G06F 11/3442* (2013.01)

(58) Field of Classification Search
CPC .......... G01S 13/04; G01S 15/04; G01S 15/87; G01S 17/88; G01S 7/539; G06K 9/00624; G01R 29/0878; G01R 29/0892; G06F 3/0237; G07C 5/0808
USPC ....................................................... 702/182
See application file for complete search history.

(56) References Cited

U.S. PATENT DOCUMENTS

| | | | |
|---|---|---|---|
| 7,663,502 B2* | 2/2010 | Breed ..................... | B60C 11/24 340/12.25 |
| 7,869,977 B2 | 1/2011 | Lewis et al. | |
| 8,255,341 B2 | 8/2012 | Gross et al. | |
| 8,929,894 B2* | 1/2015 | Catovic ................. | H04W 76/18 455/436 |
| 2001/0005145 A1 | 6/2001 | White et al. | |
| 2010/0332199 A1 | 12/2010 | Dhanekula et al. | |
| 2012/0010836 A1* | 1/2012 | Shemesh ........... | G01R 29/0814 702/76 |
| 2012/0126149 A1 | 5/2012 | Cobo et al. | |

* cited by examiner

*Primary Examiner* — Elias Desta
(74) *Attorney, Agent, or Firm* — Gilliam IP PLLC

(57) ABSTRACT

A non-intrusive system which monitors a data center by detecting electromagnetic waves alleviates a resource burden on components and is inexpensive to deploy and scale within a data center. The system detects waves using omni-directional antennas positioned throughout the data center, thus alleviating the need to physically attach directional antennas to components. The system performs a learning phase wherein representations of detected waves are mapped to occurrence of events within the data center. Once the learning phase is complete, operation of existing network monitoring tools, such as agents and probes, may cease, and the system may begin monitoring for events based on the detected waves. The system may also analyze wave data prior to the occurrence of events to identify event prediction indicators, e.g. distinctive wave values or patterns, which may be used to predict the occurrence of an event.

20 Claims, 4 Drawing Sheets

DATA CENTER MONITORING BASED ON ELECTROMAGNETIC WAVE DETECTION

BACKGROUND

The disclosure generally relates to the field of computer systems, and more particularly to computer system monitoring and analysis.

A data center monitoring system may include software or hardware, often referred to as agents or probes, which execute on components within a data center to monitor performance of the components and report events occurring at the components. Events may be specified in messages that can indicate numerous activities, such as an application finishing a task or a server failure. While the components are operating, the components radiate electromagnetic waves that may be detected by an antenna. Some monitoring systems may include directional antennas physically attached to parts of components, such as processors, to detect electromagnetic waves for monitoring performance and events of the components.

BRIEF DESCRIPTION OF THE DRAWINGS

Aspects of the disclosure may be better understood by referencing the accompanying drawings.

DESCRIPTION

Figure 1:
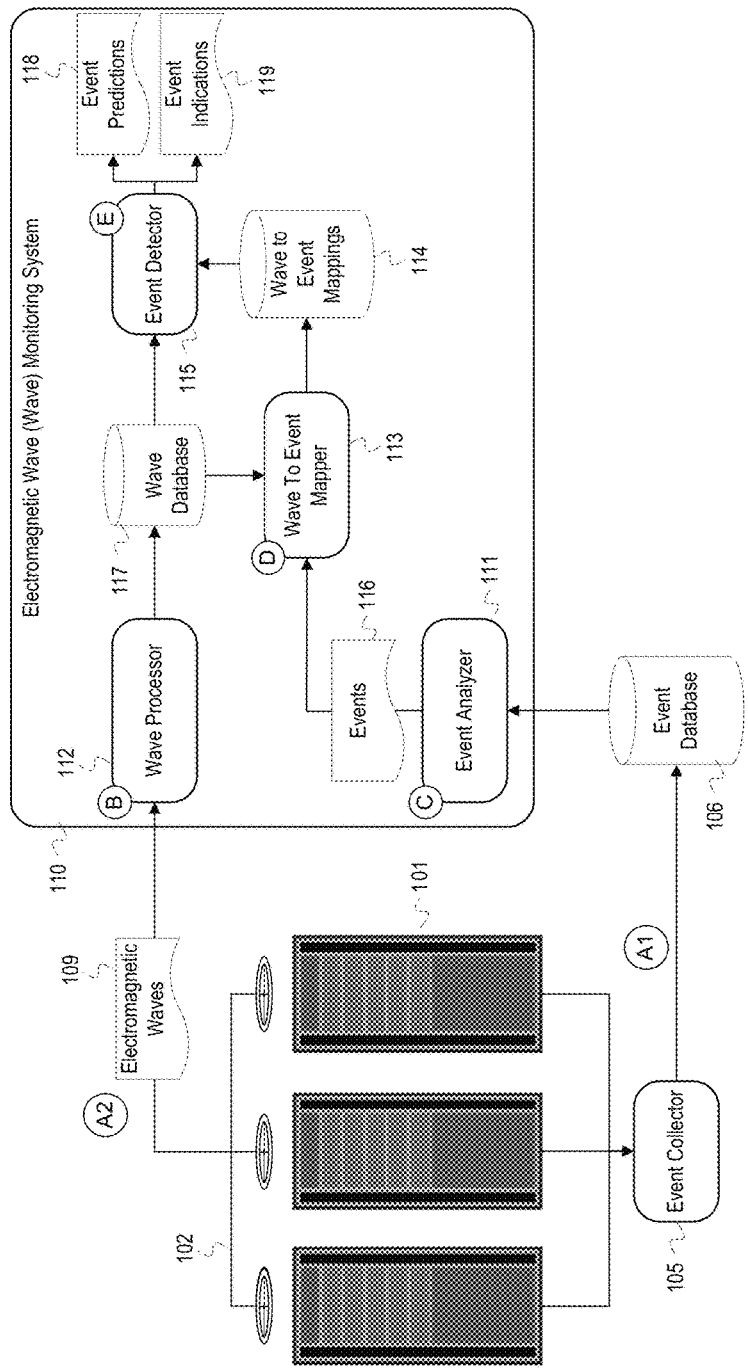
FIG. 1 depicts an example electromagnetic wave monitoring system that monitors events in a data center using electromagnetic waves.

The description that follows includes example systems, methods, techniques, and program flows that embody aspects of the disclosure. However, it is understood that this disclosure may be practiced without these specific details. For instance, this disclosure refers to monitoring components within a data center in illustrative examples. But aspects of this disclosure can be applied to monitoring electromagnetic waves and detecting events for a single computer system or other devices that generate electromagnetic waves. In other instances, well-known instruction instances, protocols, structures and techniques have not been shown in detail in order not to obfuscate the description.

Terminology

The term "component" as used in the description below encompasses both hardware and software resources. The term component may refer to a physical device such as a computer, server, router, etc.; a virtualized device such as a virtual machine or virtualized network function; or software such as an application, a process of an application, database management system, etc. A component may include other components. For example, a server component may include a web service component which includes a web application component.

The description below refers to an indication of an event ("event indication") to describe a message or notification of an event. An event is an occurrence in a system or in a component of the system at a point in time. An event often relates to resource consumption and/or state of a system or system component. As examples, an event may be that a file was added to a file system, that a number of users of an application exceeds a threshold number of users, that an amount of available memory falls below a memory amount threshold, or that a component stopped responding or failed. An event indication can reference or include information about the event and is communicated to by an agent or probe to a component/agent/process that processes event indications. Example information about an event includes an event type/code, application identifier, time of the event, severity level, event identifier, event description, etc.

The description below refers to electromagnetic waves to refer to energy radiated by electromagnetic processes that occur during operation of an electronic component. Electromagnetic waves are analog or continuous waves that may be converted into a digital signal or signals. In some instances, electromagnetic waves may be referred to as electromagnetic signals or electromagnetic radiation. A discrete portion or sample of an electromagnetic wave is referred to as electromagnetic wave data or electromagnetic wave measurements. Electromagnetic wave data or measurements may include data that indicates a pattern of the wave over a specified time period or may include values such as wave amplitude, power, or frequency.

Overview

Monitoring tools that utilize agents or probes can place a burden on resources of components and can be difficult to manage as a data center increases in size and complexity. A non-intrusive system which monitors a data center by detecting electromagnetic waves ("waves") alleviates the resource burden on components and is inexpensive to deploy and scale within a data center. The system detects waves using omnidirectional antennas positioned throughout the data center, thus alleviating the need to physically attach directional antennas to components. The system performs a learning phase wherein representations of detected waves are mapped to occurrence of events within the data center. Once the learning phase is complete, operation of existing network monitoring tools, such as agents and probes, may cease, and the system may begin monitoring for events based on the detected waves. The system may also analyze wave data prior to the occurrence of events to identify event prediction indicators, e.g. distinctive wave values or patterns, which may be used to predict the occurrence of an event.

Example Illustrations

FIG. 1 is annotated with a series of letters A-F. These letters represent stages of operations. Although these stages are ordered for this example, the stages illustrate one example to aid in understanding this disclosure and should not be used to limit the claims. Subject matter falling within the scope of the claims can vary with respect to the order and some of the operations.

FIG. 1 depicts an example electromagnetic wave monitoring system that monitors events in a data center using electromagnetic waves. FIG. 1 depicts a data center 101, an antenna array 102, an event collector 105, and an event database 106. FIG. 1 also depicts a wave monitoring system 110 that includes an event analyzer 111, a wave processor 112, a wave to event mapper 113 ("mapper 113"), and an event detector 115. The wave processor 112, the mapper 113, and the event detector 115 are communicatively coupled to the wave database 117. The mapper 113 and the event detector 115 are communicatively coupled to a wave to event mappings database 114 ("mappings database 114").

The event collector 105 and the event analyzer 111 are communicatively coupled to the event database 106.

At stage A1, the event collector 105 receives event indications from components in the data center 101. The components in the data center 101 may be a variety of hardware resources, such as hosts, servers, routers, switches, databases, temperature sensors, etc., or software resources executing on hardware resources, such as web servers, virtual machines, applications, programs, processes, database management systems, etc. The components may be instrumented with agents or probes that monitor the components and generate event indications that specify or otherwise describes events that occur at or in association with one of the components. For example, an event indication may indicate an action performed by a component such as invoking another component, storing data, restarting, etc. Event indications may also be used to report performance metrics such as available memory, processor load, storage space, network traffic, temperature, etc. The agents generate and send the event indications to the event collector 105 through a network, such as a local area network, a wide area network, or a combination of both. The event collector 105 may be a part of an event management system that includes multiple event collectors and other event processing code. After receiving the event indications, the event collector 105 stores the event indications in the event database 106 which includes a log of events that have occurred and been detected in the data center 101.

Simultaneously, at stage A2, the antenna array 102 detects electromagnetic waves 109 ("the waves 109") from the data center 101. Each antenna in the antenna array 102 detects waves from components in the data center 101 and transmits the waves to the wave processor 112. Although waves are received as a continuous analog signal, these waves are collectively referred to as the waves 109 for ease of explanation. The waves 109 are captured during a same period as events are collected by the event collector 105 (stage A1) to allow for mapping of the waves 109 to events occurring in the data center 101. The antenna array 102 comprises omnidirectional antennas that are capable of detecting the waves 109 radiated by the components in the data center 101. Other types of antennas may used in place of or in supplement to the omnidirectional antennas. For example, directional antennas may be configured to target specific components in the data center 101. FIG. 1 depicts the antenna array 102 as including one antenna for each of the three server racks; however, the number and arrangement of antennas in the antenna array 102 may vary. For example, the number of antennas may be based on physical dimensions of the data center 101; specifications of the antennas, such as size, power, or frequency; or budgetary constraints. The arrangement of the antenna array 102 may vary based on a number of antennas in the antenna array 102, dimensions and shape of the data center 101, an amount and type of components in the data center 101, etc. In general, the antennas in the antenna array 102 are evenly distributed across the data center 101 to provide sufficient coverage of the area; however, the placement of antennas in the antenna array 102 can conform to any pattern, shape, or layout. Additionally, the planar orientation of antennas in the antenna array 102 may be arranged in an azimuth plane pattern, an elevation plane pattern, or other variations of planar axes or coordinates.

At stage B, the wave processor 112 processes the waves 109 received from the antenna array 102. The antennas in the antenna array 102 are communicatively coupled to the wave processor 112. The antennas may transmit the waves 109 over a wired connection or may wirelessly transmit the waves 109. Although depicted in FIG. 1 as being sent at a single point in time, the antenna array 102 continually transmits waves to the wave processor 112 as the waves are detected. The wave processor 112 includes hardware and software for receiving and processing the waves 109. For example, the wave processor 112 may include analog to digital converters, embodied in hardware or software, that are used to convert the analog waves from the antenna array 102 to digital waves or signals for processing. The wave processor 112 timestamps and stores the raw wave data generated from the waves 109 in the wave database 117.

The wave processor 112 may also perform additional processing of the waves 109, such as generating representations of the waves 109. A representation is a collection of data that represents wave data for a point in time or a period of time. A representation may be a signature or fingerprint generated based on data of the waves 109, a unique wave pattern, or distinctive wave values, such as a power or frequency value. The wave processor 112 extract data from the waves 109 to capture readings from each antenna in the antenna array 102 at five second intervals, or the wave processor 112 may extract data from the waves 109 for a one second period every ten seconds from each antenna. The wave processor 112 may then generate a signature or identify distinct patterns or values in the extracted wave data. The wave processor 112 may generate a representation for each antenna in the antenna array 102 individually or may aggregate the extracted waved data to generate a single representation that collectively represents the waves captured by all antennas in the antenna array 102 at a point in time or for a time period. The wave processor 112 may generate a signature or fingerprint using a hash algorithm or a fingerprinting algorithm, such as MD5, Secure Hash Algorithm, Rabin's fingerprinting algorithm, etc. In addition to storing representations, the wave processor 112 may archive the raw wave data in case further processing is needed.

At stage C, the event analyzer 111 retrieves events 116 from the event database 106 and forwards the events 116 to the mapper 113. The event analyzer 111 may retrieve all events or events of a particular type(s) or may identify and retrieve anomalous events in the event database 106. An anomalous event is an event that indicates a network occurrence or condition that deviates from a normal or expected value or outcome. For example, an event may have an attribute value that exceeds or falls below a determined threshold or required value, or an event may indicate that a component shut down or restarted prior to a scheduled time. Additionally, an anomalous event may be an event that indicates a network issue such as a component failure. The event analyzer 111 may include program code for an anomaly detector that periodically scans the event database 106 for anomalous events. The anomaly detector may be configured with a set of expected values for particular events or may perform statistical analysis for different event types specified by the event indications. For example, the anomaly detector may retrieve event indications that specify an available memory attribute and determine the standard deviation for the data set. The anomaly detector may then determine all events whose available memory values fall outside the standard deviation to be anomalous. The anomaly detector may then identify the anomalous events to the event analyzer 111 so that the anomalous events may be retrieved and forwarded to the mapper 113 in the events 116.

At stage D, the mapper 113 maps the events 116 to waves or representations in the wave database 117. The mapper 113 compares timestamps of events in the events 116 and timestamps of wave data or representations in the wave database 117. The mapper 113 then maps each of the events 116 to a wave or representation based on the comparison of the timestamps. For example, if an event occurred at 6:04 a.m., the mapper 113 maps the event to a wave or representation that also occurred at or around 6:04 a.m. If the mapper 113 is unable to identify a representation that occurred within a threshold time period of an event, the mapper 113 may request that the wave processor 112 generate an additional representation for a time period corresponding to a timestamp for the event. The wave processor 112 may then retrieve archived wave data from the time period and generate a representation to be mapped to the event. The mapper 113 stores the wave to event mappings in the mappings database 114. A mapping entry includes event attributes and a representation. The event attributes may include an event type, an identifier for a component at which an event occurred, and metrics related to the event, such as temperature, processor load, etc.

The mapper 113 may also include representations that occurred prior to the event and event prediction indicators in a mapping entry for an event. The mapper 113 may retrieve representations from time periods before the timestamp of an event that is being mapped and include those representations in the mapping entry. For example, the mapper 113 may include a representation from three minutes prior to an event in the mapping. Event prediction indicators may include identifiers for other wave to event mappings. The mapper 113 may determine other events in the events 116 or from the event database 106 that were precursors to the event being mapped. The mapper 113 may then perform wave to event mappings for these events and include identifiers for those mappings in the current mapping entry and indicate that those identifiers refer to mappings that may be used to predict the occurrence of an event of the type indicated in the mapping entry. Similarly, the mapper 113 may indicate an identifier for the predicted event in the entries for the precursor events. The mapper 113 may also include characteristics, such as an estimated time period between an occurrence of the precursor event and the predicted event.

The mapper 113, or the wave processor 112, may also analyze wave data for a time period prior to the event to identify event prediction indicators. Event prediction indicators may be unique wave values, such as wave power levels or wave frequencies, or unique patterns which may be used to predict the occurrence of an event. The mapper 113 compares the wave data to base wave readings recorded during normal operations of the data center 101. The mapper 113 then identifies any waves that significantly differ from the base wave readings, such as waves with a different frequency, a higher or lower amplitude, higher or lower power, etc. The mapper 113 records the differences as event prediction indicators in mapping entries. For example, the mapper 113 may indicate that an event may occur after a wave falls below 15 decibel-milliwatts (dBm) for a threshold period of time. These readings may be associated with a particular antenna in the antenna array 102. The mapper 113 also identifies event prediction indicators by analyzing the wave data for unique wave patterns. For example, the mapper 113 may search for periods of dramatic oscillations in wave values or a series of wave values that indicate a pattern, such as an increasing or decreasing power level.

The stages A-D as described above may be considered a learning or training phase for the wave monitoring system 110. Once a sufficient number of wave to event mappings have been determined or once a mapping for each of a specified event type has been determined, the wave monitoring system 110 may begin a normal operation phase (stage E) that includes predicting and detecting the occurrence of events in the data center 101 using waves detected by the antenna array 102.

At stage E, the event detector 115 begins monitoring the waves 109 to determine event predictions 118 and event indications 119. The event predictions 118 are events that the event detector 115 determines may occur at some point in the future based on comparing wave data to event prediction indicators stored in the mappings database 114. The event indications 119 are indications for events that the event detector 115 determines have already occurred in the data center 101 based on comparing representations of the waves 109 to representations stored in mappings in the mappings database 114. The event detector 115 may retrieve wave readings or representations from the wave database 117 as they are written by the wave processor 112. Alternatively, in some implementations, the event detector 115 may receive wave readings or representations directly from the wave processor 112 in real time, or as close to real time as possible with the resources of the wave monitoring system 110. The event detector 115 then uses the wave readings and representations to search the mappings database 114. If a wave reading matches an event prediction indicator, the event detector 115 determines that an event associated with the event prediction indicator is going to occur and indicates the event in the event predictions 118. If a representation matches a representation of a mapping in the mappings database 114, the event detector 115 determines that the event associated with the representation in the mapping has occurred and adds an event indication for the event to the event indications 119.

During the normal operation of the wave monitoring system 110 at stage E, the event detector 115 is responsible for identifying occurrences of events in the data center 101. As a result, the event collector 105 may cease collecting events, and the wave monitoring system 110, instead of the event collector 105, can begin populating the event database 106 with events detected in the data center 101. However, in some implementations, the wave monitoring system 110 may be used in conjunction with the event collector 105 and an event management system (not depicted). The event indications and predictions generated by the wave monitoring system 110 may be used to increase or decrease confidence in occurrences of events collected by the event collector 105 or in root cause analysis performed by the event management system. For example, the event collector 105 may verify that an event was also detected by the wave monitoring system 110 to ensure that an event indication was not erroneously generated by a component in the data center 101. As an additional example, the event management system may determine that a root cause of an issue is a failed component in the data center 101. Because the component has failed, the event collector 105 may not receive an event indication verifying the failure of the component. The wave monitoring system 110, however, may be able to determine that the component has failed based on changes in waves detected from the data center 101.

Figure 2:
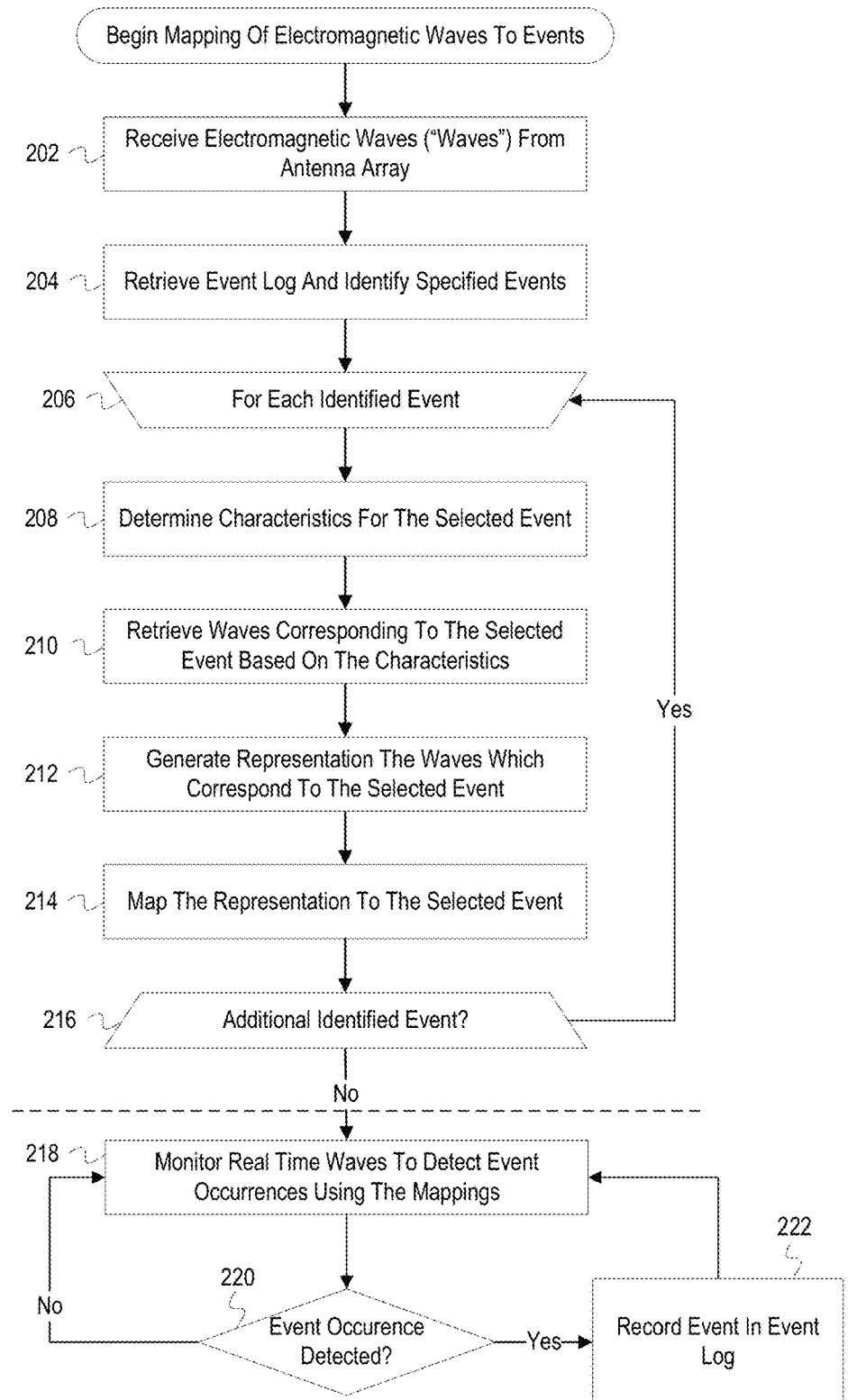
FIG. 2 depicts a flow chart with example operations for mapping waves to events.

FIG. 2 depicts a flow chart with example operations for mapping waves to events. FIG. 2 refers to a wave monitoring system similar to the wave monitoring system 110 described in FIG. 1 as performing the operations even though identification of program code can vary by developer, language, platform, etc.

A wave monitoring system ("system") receives waves from an antenna array (202). The antenna array includes one or more antennas that are positioned to detect electromagnetic waves generated by components in a data center. For example, a single antenna may be centrally located in a data center to detect electromagnetic radiation from components. Multiple antennas may be evenly distributed across the data center or may be located over specified components in the data center. For example, the antenna array may include one antenna for each rack of components. In such instances, the system may associate an identifier for each antenna with identifiers for the components in the rack or may associate an identifier for each antenna with a physical location in the data center. Upon receiving the waves, the system processes the waves and generates representations of the waves. The processing may include converting the waves from analog to digital, timestamping the waves, executing noise reduction algorithms, aggregating waves from multiple antennas, etc. For example, the system may aggregate waves from three antennas by adding or multiplying the waves together, sampling the waves for a time period and combining them into a single sample, etc. When timestamping the waves, the system may adjust the timestamp based on a calculated delay between the waves being detected at the antennas and being received by the system. The timestamp may be further adjusted to synchronize the timestamp of the waves with timestamps of events detected in the data center by an event management system.

The system retrieves an event log and identifies specified events (204). The system may be configured to only perform wave to event mappings for events of a specific type, events from a specified component, etc. The system filters the event log to identify the specified events. The system also retrieves specified attributes, such as a timestamp, component identifiers, etc.

The system begins mapping each of the identified events to a wave (206). The event currently being mapped is hereinafter referred to as "the selected event."

The system determines characteristics for the selected event (208). The characteristics may include a time when the event occurred, a duration of the event, a location in a data center where the event occurred, a component at which the event occurred, or components affected by the event. The system may determine the characteristics from attributes included in an event indication retrieved from the event log, from topology information that indicates component connections, a description of a physical layout of the data center and components therein, etc. For example, the system may determine components that were affected by an event based on the topology information indicating to which components are connected to the component at which the event occurred. As an additional example, if the event was a high temperature alert for a section of the data center, the system may determine which components are located in the section based on a physical layout of the data center.

The system retrieves waves corresponding to the selected event based on the characteristics (210). The system may retrieve wave data from a time period corresponding to the occurrence of the selected event. For example, if the selected event occurred at 2:05 and lasted for five minutes, the system retrieves wave data from 2:05 to 2:10. Alternatively, the system may retrieve the wave data at 2:05 indicating the start of the event. Depending on the antenna array configuration, the system retrieves wave data from all of the antennas or the antennas proximate to the component at which the selected event occurred. The system retrieves the processed wave data, or, if no processing was performed, the system retrieves raw wave data.

The system generates a representation based on the waves which correspond to the selected event (212). The representation may be a signature or fingerprint of the wave data that is generated using a hash algorithm or a fingerprinting algorithm. For example, the system may apply the MD5 algorithm to generate a signature of wave data from a five minute period. The representation may also be a collection of measurements from each of the antennas at a point in time. For example, the system may determine an amplitude of a wave from each of the antennas in the antenna array and record the amplitudes as a representation. Similarly, the system may determine a wave pattern such as frequencies of the waves over a time period corresponding to the selected event and record the frequencies as a representation.

The system maps the representation to the selected event (214). The system maps the representation to the selected event by storing the representation along with an identifier for the selected event in a database or other data storage. The system may mark an initial mapping of the representation to the selected event as a provisional or trial mapping and associate the mapping with a low confidence value. The confidence value indicates a reliability of the mapping, i.e. how accurately the mapping can be used to detect an occurrence of the selected event. As additional events similar to the selected event occur and are mapped to similar representations, the system increases the confidence value and removes the provisional marking from the mapping once a threshold has been satisfied. For example, after an initial mapping of the representation to the selected event, the system may remove the provisional marking once a threshold of five events similar to the selected event occur and are mapped to representations similar to the representation stored in the initial mapping. The system may increase the confidence value of the mapping each time another event is detected and mapped to a similar representation.

The system determines whether there is an additional event (216). If there is an additional event, the system selects the next event (206). The operations for mapping waves to events (202-216) may be considered a learning phase the repeats periodically or as additional events that have not been mapped are detected. If there is not an additional event to be mapped, the learning phase operations end, as indicated by the dashed line in FIG. 2.

In parallel to or subsequent to the learning phase operations, the system monitors real time waves to detect event occurrences using the mappings (218). The system continues to receive and process waves detected by the antenna array. The system may generate representations of the waves in accordance with a configured sample rate. For example, the system may generate a representation of the waves every second, every minute, etc. Additionally, the system may sample the incoming waves using a sliding time window. For example, the system may retrieve measurements from the real time waves for a first time window spanning a time period from 0 to 1 second and then a second time window spanning from 0.5 to 1.5 seconds. The system compares the representations to the representations recorded in the wave to event mappings. The system may load frequently or recently used mappings in memory or cache of the system to increase the speed of comparisons.

The system determines whether an event occurrence is detected (220). If the system does not detect a match between a representation generated based on the real time wave data and a representation stored in the mappings, the system continues monitoring the real time wave data (218).

If the system does detect a match between a representation generated based on the real time wave data and a representation stored in the mappings, the system determines that an event indicated in the mapping has occurred. The system then records the event in an event log (222). Additionally, depending on the type of event, the system may generate an alert or an alarm or supply the event to network monitoring software.

Figure 3:
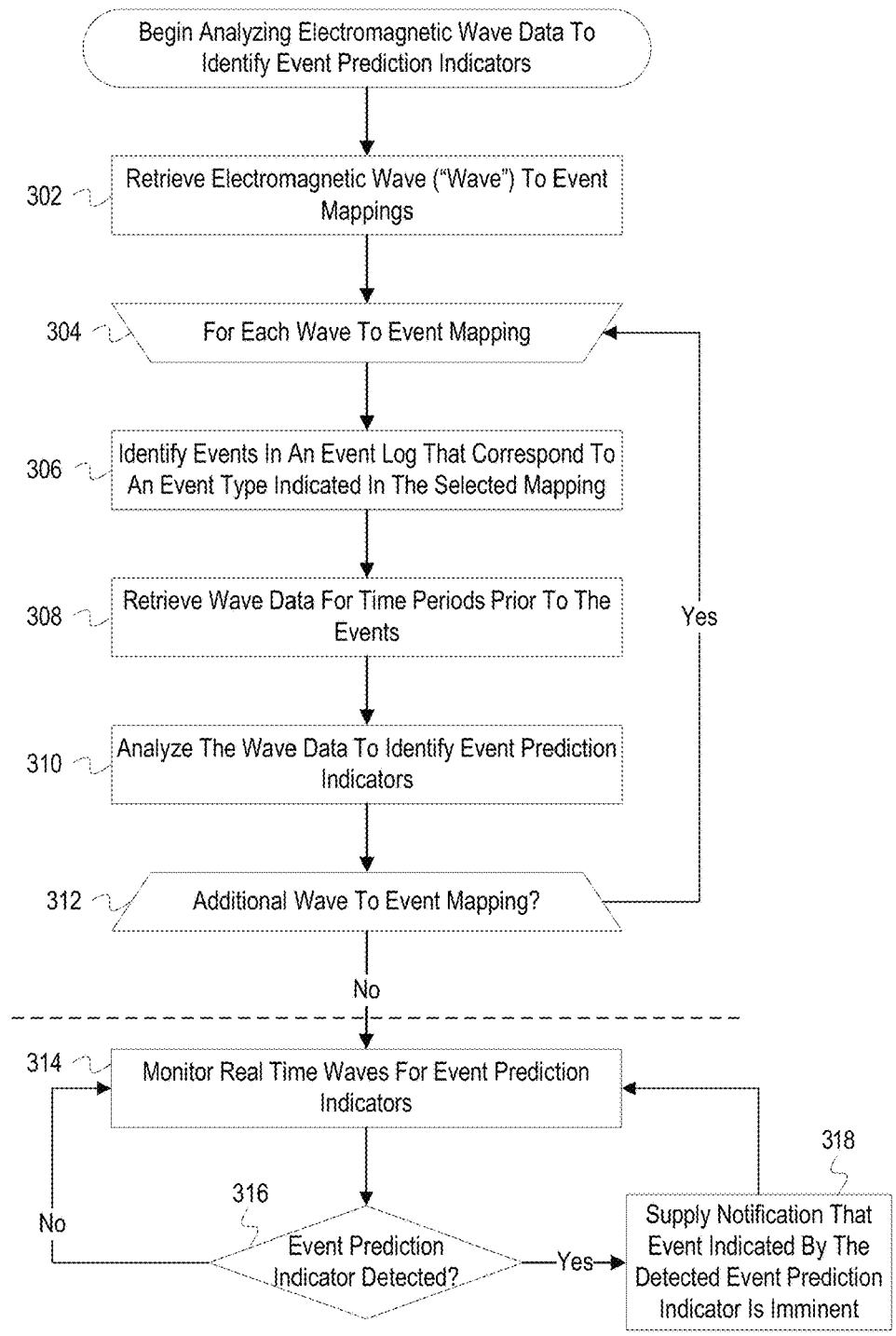
FIG. 3 depicts a flow chart with example operations for analyzing wave data to identify event prediction indicators.

FIG. 3 depicts a flow chart with example operations for analyzing wave data to identify event prediction indicators. FIG. 3 refers to a wave monitoring system similar to the wave monitoring system 110 described in FIG. 1 as performing the operations even though identification of program code can vary by developer, language, platform, etc.

A wave monitoring system ("system") retrieves wave to event mappings (302). The system retrieves mappings from a database for which event prediction indicators have not been determined. In some instances, the system also retrieves mappings for which events indicated in the mappings have recently occurred, even if event prediction indicators have already been determine. For these mappings, the system may attempt to determine additional event prediction indicators or validate existing event prediction indicators.

The system begins determining event prediction indicators for each retrieved wave to event mapping (304). The wave to event mapping for which event prediction indicators are currently being determined is hereinafter referred to as "the selected mapping."

The system identifies events in an event log that correspond to an event type indicated in the selected mapping (306). The system may determine event prediction indicators from a single occurrence of an event; however, accuracy of event prediction indicators may be improved by verifying that the event prediction indicators were detected at each occurrence of an event. As a result, the system analyzes the event log to identify events similar to the event indicated in the selected mapping. The system may identify similar events as events that are of the same type, of the same type and occurring at a same component, etc.

The system retrieves wave data for time periods prior to the identified events (308). The system may retrieve wave data that has been processed or raw wave data that has been archived. The amount of wave data retrieved by the system may vary based on event type or a desired prediction time. For example, for critical events such as a system failure, the system may be configured to retrieve a thirty minute period of wave data in order to identify event prediction indicators that allow for sufficient time to prepare for a failure.

The system analyzes the wave data to identify event prediction indicators (310). The system analyzes the wave data to identify distinctive wave values, such as a high or low frequency, high or low amplitude, etc. The system may determine that a wave value is distinctive by comparing the wave values to wave values detected during a normal operating period of a data center. Additionally, the system may compare the wave values to wave values that were detected after an event occurred. If wave data for multiple events was retrieved, the system verifies that the distinctive wave values were detected prior to each occurrence of an event indicated in the event mapping. After determining the distinctive wave values, the system stores the wave values as event prediction indicators in the selected mapping. The system may also store a time that a distinctive wave occurred in relation to an occurrence of the event so that a time to event may be include in event predictions. For example, the system may determine that an event prediction indicator typically occurs two minutes prior to an event which it predicts.

The system determines whether there is an additional wave to event mapping (312). If there is an additional wave to event mapping, the system selects the next wave to event mapping (304). The operations for determining event prediction indicators (302-312) may be considered a learning phase the repeats periodically or as new wave to event mappings are determined. If there is not an additional wave to event mapping, the learning phase operations end, as indicated by the dashed line in FIG. 3.

In parallel to or subsequent to the learning phase operations, the system monitors real time wave data for event prediction indicators (314). The system monitors the real time wave data in a manner similar to that indicated at block 218 of FIG. 2. However, in addition to comparing representations to representations indicated in wave to event mappings, the system also compares wave values to wave values indicated in event prediction indicators. The system samples wave values at configured intervals to identify distinct wave values. If a distinct wave value is detected, the system searches the event prediction indicators to determine whether the value matches any of the wave indicators. In some implementations, the system is configured to search the event prediction indicators when wave values that exceed or fall below thresholds are detected. The thresholds may be based on wave values indicated in the event prediction indicators. For example, if a first event prediction indicator includes a wave value of an amplitude of 95 dBm and a second event prediction indicator includes a value of 98 dBm, the system may be configured to search the event prediction indicators when wave values are equal to or greater than 95 dBm.

The system determines whether an event prediction indicator is detected (316). If the system does not detect a match between a wave value and an event prediction indicator stored in the mappings, the system continues monitoring the real time wave data (314).

If the system does detect a match between a wave value and an event prediction indicator stored in the mappings, the system determines that an event prediction indicator has been detected and supplies a notification that an event associated with the event prediction indicator is likely to occur (318). Additionally, depending on the type of event to occur, the system may generate an alert or an alarm or supply the event prediction to network monitoring software. The system may also approximate a time at which the event will occur. Furthermore, if a wave to event mapping includes multiple event prediction indicators, the system may indicate a confidence that the event will occur based on the number of event prediction indicators that were detect. The confidence value may increase as additional event prediction indicators are detected. For example, if four event prediction indicators are associated with an event, the system may indicate a 25% confidence level after the first event is detected and increase the confidence level accordingly as the remaining event prediction indicators are detected.

Variations

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 212 and 214 of FIG. 2 can be performed in parallel or concurrently. Additionally, the operations depicted in block 306 of FIG. 3 may not be performed. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

Some operations above iterate through sets of items, such as events and wave to event mappings. In some implementations, events may be iterated over according to an ordering of events, an indication of event importance, an event timestamp, etc. Also, the number of iterations for loop operations may vary. Different techniques for processing and correlating wave to event mappings may require fewer iterations or more iterations. For example, multiple wave to event mappings may be processed or correlated in parallel or may share similar event prediction indicators. For example, some wave to event mappings may indicate events of the same type but include different mapping records because the events occurred at different components.

As described above in FIG. 3, an electromagnetic wave monitoring system may reevaluate event prediction indicators to determine whether the event prediction indicators are valid or if the event prediction indicators are falsely indicating that an event is going to occur. To determine accuracy of event prediction indicators, the system tracks a number of times that an event prediction indicator successfully predicted the future occurrence of an event. The system stores the success rate, e.g. indicated an event 60% of the time, along with the event prediction indicator so that a confidence in the prediction may be displayed to a user. Conversely, the system may detect instances in which an event occurred but was not previously predicted. In such instances, the system may reevaluate wave data surrounding the event to attempt to identify different, and potentially more accurate, event prediction indicators.

The variations described above do not encompass all possible variations, implementations, or embodiments of the present disclosure. Other variations, modifications, additions, and improvements are possible.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

Figure 4:
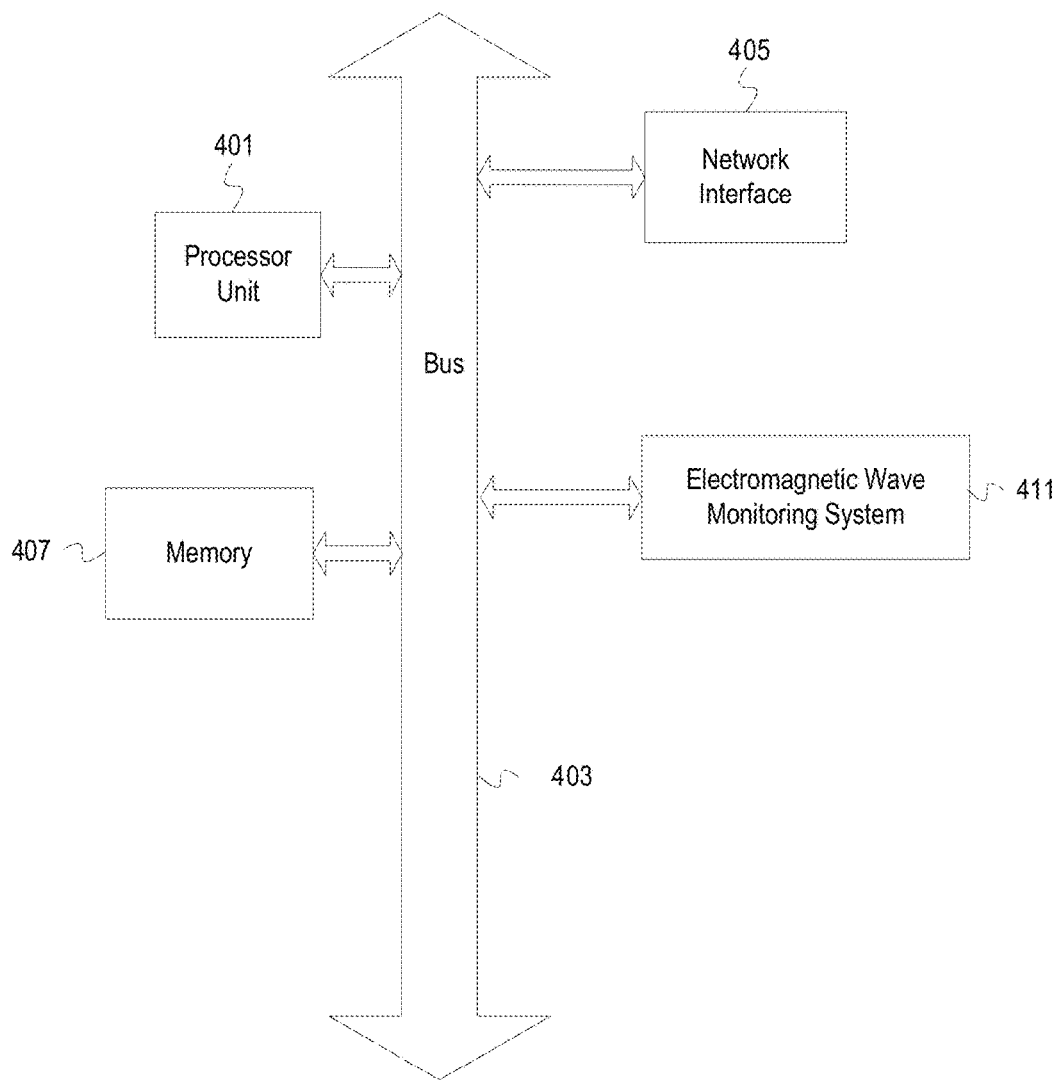
FIG. 4 depicts an example computer system with an electromagnetic wave monitoring system.

FIG. 4 depicts an example computer system with an electromagnetic wave monitoring system. The computer system includes a processor unit 401 (possibly including multiple processors, multiple cores, multiple nodes, and/or implementing multi-threading, etc.). The computer system includes memory 407. The memory 407 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 403 (e.g., PCI, ISA, PCI-Express, HyperTransport® bus, InfiniBand® bus, NuBus, etc.) and a network interface 405 (e.g., a Fiber Channel interface, an Ethernet interface, an internet small computer system interface, SONET interface, wireless interface, etc.). The system also includes an electromagnetic wave monitoring system 411. The electromagnetic wave monitoring system 411 monitors electromagnetic waves radiated by components in a data center to identify and predict events encountered by the components. Any one of the previously described functionalities may be partially (or entirely) implemented in hardware and/or on the processor unit 401. For example, the functionality may be implemented with an application specific integrated circuit, in logic implemented in the processor unit 401, in a coprocessor on a peripheral device or card, etc. Further, first realizations may include fewer or additional components not illustrated in FIG. 4 (e.g., video cards, audio cards, additional network interfaces, peripheral devices, etc.). The processor unit 401 and the network interface 405 are coupled to the bus 403. Although illustrated as being coupled to the bus 403, the memory 407 may be coupled to the processor unit 401.

While the aspects of the disclosure are described with reference to various implementations and exploitations, it will be understood that these aspects are illustrative and that the scope of the claims is not limited to them. In general, techniques for detecting events based on electromagnetic waves as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

As used herein, the term "or" is inclusive unless otherwise explicitly noted. Thus, the phrase "at least one of A, B, or C" is satisfied by any element from the set {A, B, C} or any combination thereof, including multiples of any element.

What is claimed is:

1. A method comprising:
   detecting first electromagnetic waves radiated by a plurality of devices in a data center;
   based on receiving an indication of a first event occurring at a first device of the plurality of devices,
      capturing first measurements from the first electromagnetic waves based, at least in part, on a time of the first event;
      generating a first representation of the first electromagnetic waves based, at least in part, on the first measurements of the first electromagnetic waves; and
      mapping the first representation to an identifier for the first event.

2. The method of claim 1 further comprising:
   based on detecting second electromagnetic waves radiated by the plurality of devices,
      sampling the second electromagnetic waves to generate a set of samples;
      generating a set of representations based, at least in part, on the set of samples;
      comparing each of the set of representations to the first representation of the first electromagnetic waves; and
      based on detecting a match between a second representation of the set of representations and the first representation, indicating that the first event has occurred.

3. The method of claim 2, wherein mapping the first representation to the identifier for the first event comprises storing the first representation along with the identifier in an entry in a database, wherein comparing each of the set of representations to the first representation comprises querying the database with each of the set of representations.

4. The method of claim 2, wherein sampling the second electromagnetic waves to generate the set of samples comprises capturing samples at specified time intervals while the second electromagnetic waves are being detected, wherein a sample comprises values of the second electromagnetic waves for a period of time.

5. The method of claim 1 further comprising:
   capturing second measurements from the first electromagnetic waves based, at least in part, on a time period prior to the time of the first event;
   comparing the second measurements to measurements of second electromagnetic waves, wherein the second electromagnetic waves are electromagnetic waves that were detected during a normal operating period of the plurality of devices; and
   identifying an event prediction indicator in the second measurements, wherein the event prediction indicator is a value in the second measurements that differs from a value in the measurements of the second electromagnetic waves.

6. The method of claim 5 further comprising:
   based on detecting third electromagnetic waves radiated by the plurality of devices,
      determining that a value in the third electromagnetic waves matches the event prediction indicator; and
      based on determining that the value in the third electromagnetic waves matches the event prediction indicator, generating an indication that the first event may occur.

7. The method of claim 1, wherein generating the first representation of the first electromagnetic waves based, at least in part, on the first measurements of the first electromagnetic waves comprises generating a signature of the first measurements.

8. The method of claim 1, wherein detecting the first electromagnetic waves radiated by the plurality of devices in the data center comprises receiving the first electromagnetic waves from one or more omnidirectional antennas positioned throughout the data center to capture the first electromagnetic waves from the plurality of devices.

9. The method of claim 1, wherein capturing the first measurements from the first electromagnetic waves based, at least in part, on the time of the first event comprises:
   tagging the first electromagnetic waves with a first timestamp corresponding to a time the first electromagnetic waves were detected;
   determining the time of the first event based, at least in part, on a second timestamp associated with the indication of the first event; and
   capturing the first measurements from a portion of the first electromagnetic waves that were detected at a time period comprising the time of the first event, wherein the portion of the first electromagnetic waves that were detected at the time period comprising the time of the first event is identified based, at least in part, on the first timestamp and the second timestamp.

10. One or more non-transitory machine-readable media having program code for electromagnetic wave based event detection stored therein, the program code to:
- create a repository of mappings between system events of a plurality of devices in a data center and first representations of past electromagnetic waves that occurred in the data center;
- generate second representations of electromagnetic waves that occur in the data center;
- compare the second representations with the first representations; and
- based on detection of a matching representation between the first and the second representations, generate an indication of a system event that is mapped to the matching representation in the repository.

11. The non-transitory machine-readable media of claim 10, wherein the program code to create the repository of mappings comprises program code to:
- record representations of electromagnetic waves detected in the data center by a set of one or more antennas;
- associate system events detected at the plurality of devices with the representations based, at least in part, on timestamps of the system events; and
- create a mapping between a system event and a representation based, at least in, part, on a confidence value of an association between the system event and the electromagnetic wave exceeding a threshold.

12. The non-transitory machine-readable media of claim 10, wherein the program code to generate the second representations of electromagnetic waves that occur in the data center comprises program code to generate the second representations for electromagnetic waves detected in the data center for a sliding window of time.

13. An apparatus comprising:
- a processor; and
- a machine-readable medium having program code executable by the processor to cause the apparatus to,
  - detect first electromagnetic waves radiated by a plurality of devices in a data center;
  - based on receipt of an indication of a first event occurring at a first device of the plurality of devices, capture first measurements from the first electromagnetic waves based, at least in part, on a time of the first event;
  - generate a first representation of the first electromagnetic waves based, at least in part, on the first measurements of the first electromagnetic waves; and
  - map the first representation to an identifier for the first event.

14. The apparatus of claim 13 further comprising program code executable by the processor to cause the apparatus to:
- based on detection of second electromagnetic waves radiated by the plurality of devices,
  - sample the second electromagnetic waves to generate a set of samples;
  - generate a set of representations based, at least in part, on the set of samples;
  - compare each of the set of representations to the first representation of the first electromagnetic waves; and
  - based on detecting a match between a second representation of the set of representations and the first representation, indicate that the first event has occurred.

15. The apparatus of claim 14, wherein the program code executable by the processor to cause the apparatus to map the first representation to the identifier for the first event comprises program code executable by the processor to cause the apparatus to store the first representation along with the identifier in an entry in a database, wherein the program code executable by the processor to cause the apparatus to compare each of the set of representations to the first representation comprises program code executable by the processor to cause the apparatus to query the database with each of the set of representations.

16. The apparatus of claim 14, wherein the program code executable by the processor to cause the apparatus to sample the second electromagnetic waves to generate the set of samples comprises program code executable by the processor to cause the apparatus to capture samples at specified time intervals while the second electromagnetic waves are being detected, wherein a sample comprises values of the second electromagnetic waves for a period of time.

17. The apparatus of claim 13 further comprising program code executable by the processor to cause the apparatus to:
- capture second measurements from the first electromagnetic waves based, at least in part, on a time period prior to the time of the first event;
- compare the second measurements to measurements of second electromagnetic waves, wherein the second electromagnetic waves are electromagnetic waves that were detected during a normal operating period of the plurality of devices; and
- identify an event prediction indicator in the second measurements, wherein the event prediction indicator is a value in the second measurements that differs from a value in the measurements of the second electromagnetic waves.

18. The apparatus of claim 17 further comprising program code executable by the processor to cause the apparatus to:
- based on detection of third electromagnetic waves radiated by the plurality of devices,
  - determine that a value in the third electromagnetic waves matches the event prediction indicator; and
  - based on a determination that the value in the third electromagnetic waves matches the event prediction indicator, generate an indication that the first event may occur.

19. The apparatus of claim 13, wherein the program code executable by the processor to cause the apparatus to generate the first representation of the first electromagnetic waves based, at least in part, on the first measurements of the first electromagnetic waves comprises program code executable by the processor to cause the apparatus to generate a signature of the first measurements.

20. The apparatus of claim 13, wherein the program code executable by the processor to cause the apparatus to detect the first electromagnetic waves radiated by the plurality of devices in the data center comprises program code executable by the processor to cause the apparatus to receive the first electromagnetic waves from one or more omnidirectional antennas positioned throughout the data center to capture the first electromagnetic waves from the plurality of devices.

* * * * *